United States Patent [19]
Lin

[11] Patent Number: 6,027,802
[45] Date of Patent: Feb. 22, 2000

[54] COVER TAPE FOR PACKAGING

[75] Inventor: David Lin, Hsin-Chuang, Taiwan

[73] Assignee: Four Piliars Enterprise Co., Ltd., San-Chung, Taiwan

[21] Appl. No.: 08/956,431

[22] Filed: Oct. 23, 1997

[51] Int. Cl.$^7$ .................................................. B32B 7/12
[52] U.S. Cl. .................. 428/343; 428/42.2; 428/42.3; 428/345; 428/347; 428/349; 428/354; 428/352; 428/353; 428/355 R; 428/922; 206/713; 206/714; 206/717
[58] Field of Search ................................. 428/345, 354, 428/353, 343, 42.2, 42.3, 922, 355 R, 352, 349, 347; 206/11 AS, 717, 714, 713

[56] References Cited

U.S. PATENT DOCUMENTS

| | | | |
|---|---|---|---|
| 4,800,115 | 1/1989 | Havens | 428/178 |
| 4,867,308 | 9/1989 | Crawford et al. | 206/714 |
| 4,929,486 | 5/1990 | Itou et al. | 428/77 |
| 4,963,405 | 10/1990 | Yamashita et al. . | |
| 4,966,282 | 10/1990 | Kawanishi et al. | 206/714 |
| 5,064,064 | 11/1991 | Itou et al. | 206/714 |
| 5,208,103 | 5/1993 | Miyamoto et al. . | |
| 5,346,765 | 9/1994 | Maeda et al. | 428/354 |
| 5,390,472 | 2/1995 | Weiler et al. | 53/412 |
| 5,441,809 | 8/1995 | Akhter | 428/354 |
| 5,599,621 | 2/1997 | Akhter | 428/349 |
| 5,670,254 | 9/1997 | Akhter | 428/349 |
| 5,691,038 | 11/1997 | Hirata et al. | 428/194 |
| 5,765,692 | 6/1998 | Schenz | 206/713 |
| 5,846,621 | 12/1998 | Nagamatsu | 428/40.1 |
| 5,846,652 | 12/1998 | Yamashita | 428/349 |
| 5,857,572 | 1/1999 | Bird et al. | 206/713 |
| 5,882,753 | 3/1999 | Pedginski et al. | 428/40.7 |

*Primary Examiner*—Blaine Copenheaver
*Assistant Examiner*—Arti R. Singh
*Attorney, Agent, or Firm*—Bacon & Thomas

[57] ABSTRACT

A cover tape adapted to seal individual components in respective recesses of a carrier tape or a two dimensional carrier tray, including a randomly embossed layer, an adhesive layer covered over one side of the randomly embossed layer, and a non-adhesive layer adhered to the adhesive layer to prevent the components from adhering to the adhesive layer, the randomly embossed layer including an adhesion portion adapted for fastening to the carrier tape through the adhesive layer, a torn strip portion adapted to enhance the cohesive strength of the randomly embossed layer through the non-adhesive layer, and a stress concentration zone disposed between the contact border line of the adhesion portion and the contact border line of the non-adhesive layer, the torn strip portion being peeled off from the adhesion portion along the stress concentration zone before the removal of the encased components from the carrier tape, the applied tearing force to peel off the torn strip portion from the adhesion portion along the stress concentration zone being smaller than the adhesion force existing between the adhesion portion of the randomly embossed layer and the carrier tape through the adhesive layer, and the adhesion force existing between the torn strip portion and the non-adhesive layer through the adhesive layer.

27 Claims, 8 Drawing Sheets

COVER TAPE FOR PACKAGING

BACKGROUND OF THE INVENTION

The present invention relates to a cover tape for packaging, and more particularly to such a cover tape adapted for use with a carrier tape to encase electronic components or other parts in the application of surface mounted technology.

Previously, container means molded from plastics were coupled with adhesive coated films for encasing electronic components so as to protect electronic components during delivery. Recently, in order to promote the efficiency of electronic component surface mounted technology; tape-like electronic component package means having pockets for accommodating electronic components are intensively used for electronic component packaging. Exemplars of these tape-like electronic component package means can be found in the U.S. Pat. Nos. 4,724,958 and 4,963,405. According to the U.S. Pat. No. 4,724,958, a tape-like electronic component package is provided, which comprises an elongated receiving tape having a plurality of cavities adapted to hold a respective electronic component and a cover tape means enclosing the cavities. According to the U.S. Pat. No. 4,963,405, a tape for encasing electronic parts is provided, which comprises a carrier tape having a plurality of recesses for encasing electronic parts, a plurality of guide perforations, and a cover tape pasted onto the carrier tape with an adhesive so as to seal only the recesses while leaving the guide perforations open. Currently, chip type electronic parts used for surface mounting are commonly supplied by being contained in a tape-like package consisting of a carrier tape having a plurality of recesses for encasing chip type electronic parts and a cover tape sealed to the carrier tape. The electronic parts contained in the tape-like package are automatically taken out after peeling the cover tape off the tape-like package, and are mounted on the surface of an electronic circuit substrate. In actual practice, the cover tape is coated or adhered with an adhesive layer adapted for fastening to the border area of the carrier tape. The material of the adhesive layer can be selected from the group consisting of the pressure sensitive adhesives and the heat sealable thermoplastics. The adhesive layer must provide proper adhesion strength so that the cover tape can be firmly bonded to the carrier tape, and then can be also smoothly peeled off from the carrier tape for permitting the encased electronic parts to be taken out from the carrier tape. However, it is not easy to have an adhesion layer between the cover tape and the carrier tape providing adequate adhesion strength and a low peeling-off strength simultaneously, because both factors are usually work against each other. Excessively high or low adhesion strength or uneven adhesion strength may cause certain problems. For example, when the adhesion strength is excessively low, the sealed cover tape may be separated from the carrier tape due to the unexpected minor bumping at the time of the package transfer, and the encased electronic components may drop off. When the adhesion strength is excessively high, the much higher force must be applied to the cover tape to peel it off from the carrier tape, thereby causing a step motion and a subsequently vibration problem. When the vibration occurs, encased electronic components may be forced to jump out of the carrier tape. More particularly, electronic components to be surface-mounted such as liquid crystal display chips, diodes, passive components including resistors, conductors and capacitors, and active components including integrated circuit, etc., have come to be made in chips of higher capability and smaller size. Minor vibration may cause the small electronic components to fall off from the carrier tape. If adhesion strength is not uniformly distributed, the both aforesaid problems may occur when peeling off the cover tape from the carrier tape. In order to eliminate the aforesaid problems, there are limitations on material selection of the cover tape and the fabrication of the cover tape. Sealing temperature, sealing pressure and sealing speed must be taken into account if the cover tape is made of the heat sealable adhesives or thermoplastics when bonding the cover tape to the carrier tape. The sealing of the cover tape to the carrier tape also has a great concern with the setting time of the thermoplastics because of their rheological properties. Generally, a faster sealing process requires a relatively higher sealing temperature, and the material must have a relatively higher coefficient of heat conductivity or shorter setting time. However, polymer is basically a good heat insulating matter. This poor heat conductive property is contrary to the short setting time requirement. If there is to add an additive having a relatively higher heat conductivity, other negative effects such as an opaque feature due to the light scattering from the different phase domains may occur. All these factors affect the development of candidate materials. It is indeed a challenge to develop an adhesive layer material for the cover tape that provides the suitable adhesion strength, achieves satisfactory packaging effect, and is also suitable for use in different processing conditions. Further, when peeling off the cover tape from the carrier tape, the unexpected abnormal peeling-off effects such as creaking in the unexpected direction must be avoided. These abnormal defects may cause the cover tape to tear off or break at the improper locations, or to have a part remained and covered on the recesses of the carrier tape. All these conditions affect the manufacturing process and productivity.

Figure 1A:
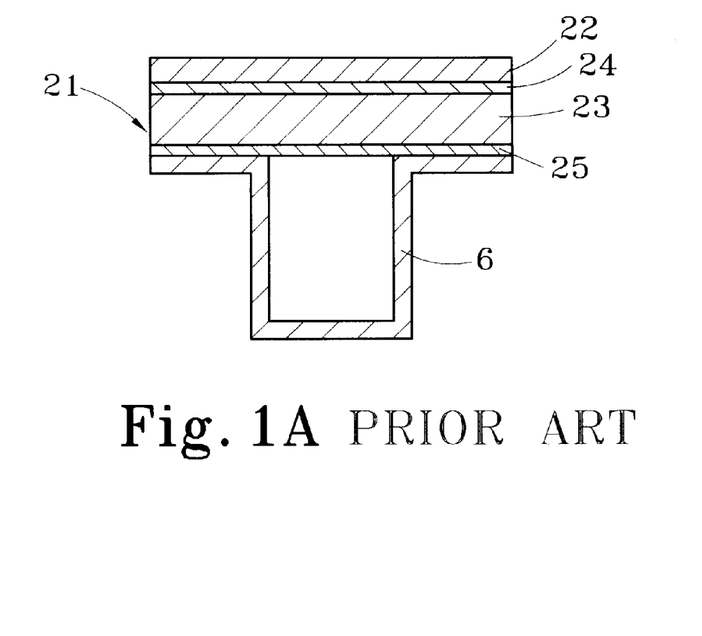
FIG. 1A is a cross-sectional view showing a cover tape bonded to a carrier tape according to the prior art.
Figure 1B:
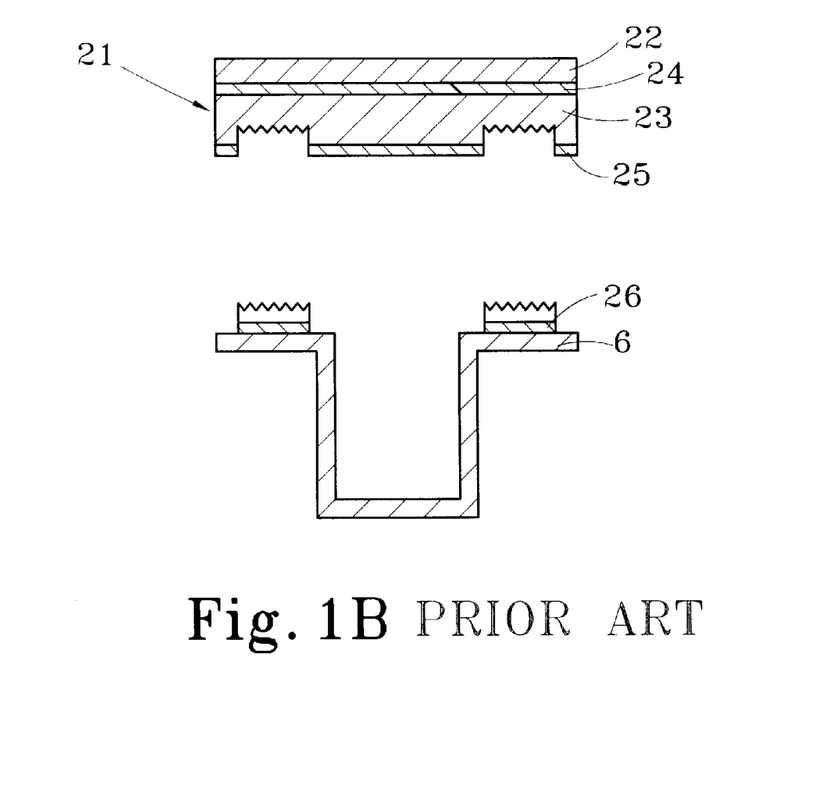
FIG. 1B is a cross-sectional view showing a state of the cover tape of FIG. 1A where the cover tape has been bonded to the carrier tape and then peeled off therefrom.

FIGS. 1A and 1B show a cover tape for packaging chip type electronic parts according to the U.S. Pat. No. 5,208,103. The cover tape 21 comprises a biaxially oriented film 22, an intermediate layer 23, a first adhesive layer 24 sealed between the biaxially oriented film 22 and the intermediate layer 23, and a second adhesive layer 25 laminated between the intermediate layer 23 and the carrier tape 6. The cover tape 21 is specially designed so that the intermediate layer 23 has weaker cohesive strength. When the cover tape 21 is heat-sealed to the carrier tape 6, a heat-sealed portion 26 is formed in the cover tape 21, and the adhesion force of the heat-sealed portion 26 is greater than the cohesive strength of the intermediate layer 23 when the cover tape 21 is peeled off from the carrier tape 6. Therefore, the peeled-off interface is within the intermediate layer 23, and the tearing force required is about 10–120 grams per bonded millimeter. However, when the cover tape 21 is peeled off after it has been bonded to the carrier tape 6, the peeling direction of the cover tape 21 has a concern with the tearing force, the peeling angle and direction, the peeling speed, and the heat-sealed portion 26. Therefore, the peeling direction may be affected by the aforesaid factors to cause an improper peeling, for example, the cover tape 21 may be peeled off from the carrier tape 6 at a angle to the machine direction or at an angle to the bonding line, causing the cover tape 21 to break improperly or the manufacturing process to stop.

Figure 2A:
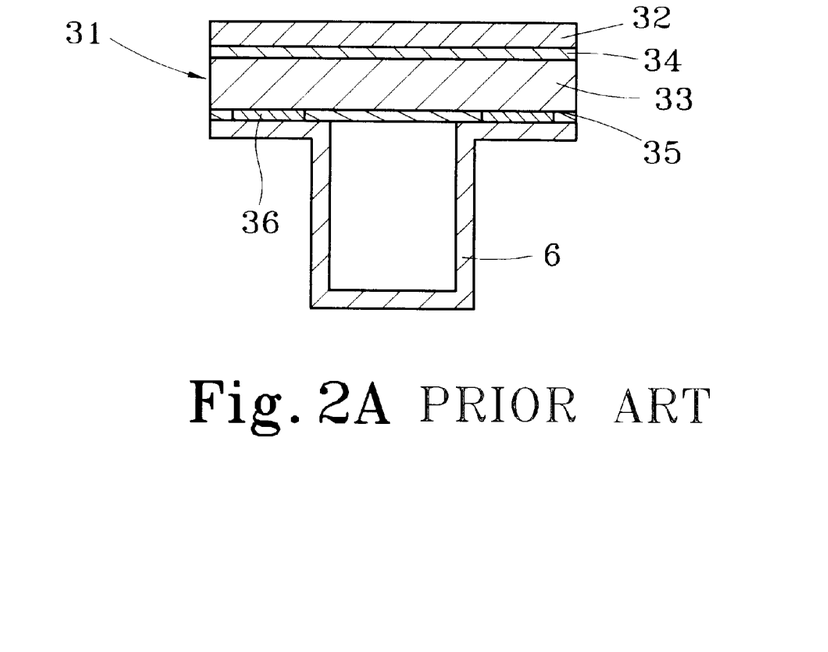
FIG. 2A is a cross-sectional view showing another structure of cover tape bonded to a carrier tape according to the prior art.
Figure 2B:
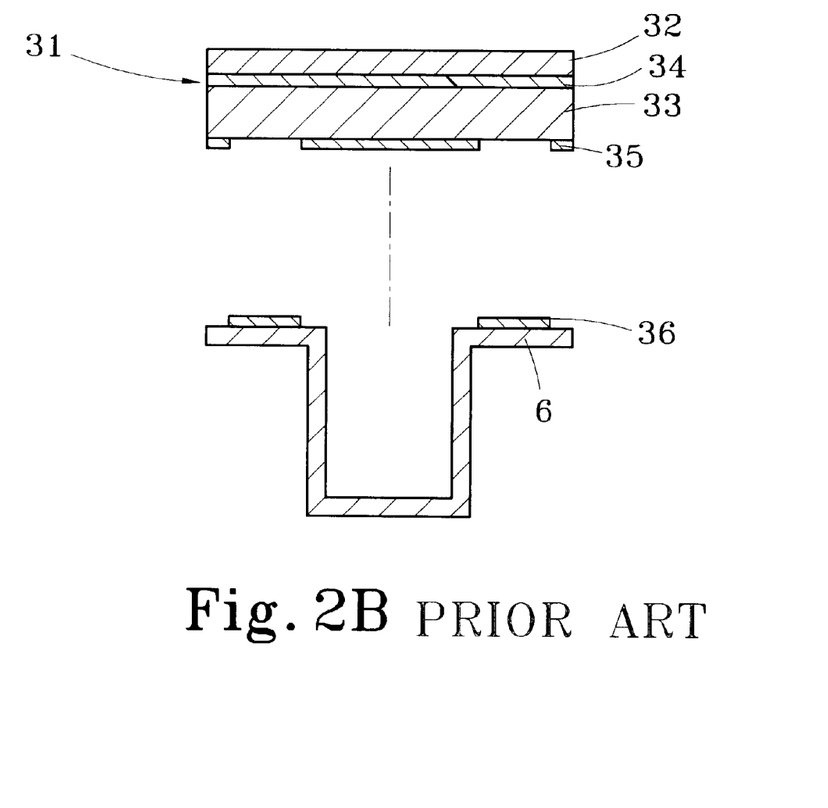
FIG. 2B is a cross-sectional view showing a state of the cover tape of FIG. 2A where the cover tape has been bonded to the carrier tape and then peeled off therefrom.

FIGS. 2A and 2B show a cover tape for packaging electronic chip according to the U.S. Pat. No. 5,346,765. The cover tape 31 comprises a biaxially oriented film 32, an intermediate layer 33, a first adhesive layer 34 sealed between the biaxially oriented film 32 and the intermediate layer 33, and a second adhesive layer 35 sealed between the intermediate layer 34 and the carrier tape 6. A heat-sealed portion 36 is formed in the cover tape 31 when the cover tape 31 is heat-sealed to the carrier tape 6, and the adhesion force of the heat-sealed portion 36 is greater than the adhesion force between the intermediate layer 33 and the second adhesive layer 35 when the cover tape 31 is peeled off from the carrier tape 6. Therefore, the peeled-off interface exists between the intermediate layer 33 and the second adhesive layer 35, and the tearing force required is about 10–120 grams per bonded millimeter, i.e., the adhesion strength of the cover tape 31 to the carrier tape 6 is about 10–120 grams per bonded millimeter. This weak adhesion strength may cause the cover tape 31 to be separated from the carrier tape 6 due to a minor impact during a transfer of the package. When the aforesaid adhesive layers are designed for heat-sealed packaging, the hot melt elastomers or thermoplastics and their mixed additives which are used for the adhesive layers usually have the potentially reactive functional group or the thermally unstable functional group. Generally, the hot melt block copolymers such as the styrene-isoprene-styrene (SIS), the styrene-butadiene-styrene (SBS) and the butyl rubber (BR), and the blended resins usually have an unsaturated bonding structure. The heat-sealable thermoplastics used to have the additive with the structure featured either a low glass transition temperature or thermally unstable functional group, for example, the thermal unstable functional group of the ester linkage, may be caused to decompose easily by heat. Materials having the unstable functional group, which is unstable due to moisture or heat, tend to be affected by humidity or temperature, or both of them. For example, because of the nature of the hydrogen bonding, the material having the carboxyl function group tends to deteriorate upon the effect of humidity and high temperature. Ethylene-vinyl acetate (EVA) either blending with other material or copolymerizing with the other material having the ester linkage is a functional group sensitive to high temperature and humidity. The aforesaid materials tend to be affected by weather, storage temperature and humidity. The material properties may change over time, more particularly the speed of material property deterioration is accelerated when under high temperature and high humidity conditions simultaneously, thereby causing the materials to deviate from their application condition and the shelf life of the materials to be shortened. It is common that the physical properties of the adhesive materials start to deviate from their application range at a certain length of time after the storage of the materials. If the adhesion strength is changed to an excessively low level, the cover tape may be separated from the bonded carrier tape causing the encapsulated parts to drop off from the recesses. On the other hand, if the adhesion strength is changed to an excessively high level, the applied peeling force may not be uniformly distributed over the cover layer when the cover tape is peeled off from the carrier layer. Thereby, it causes the carrier tape to vibrate and a consequent jump-off problem of the sealed parts.

Figure 3:
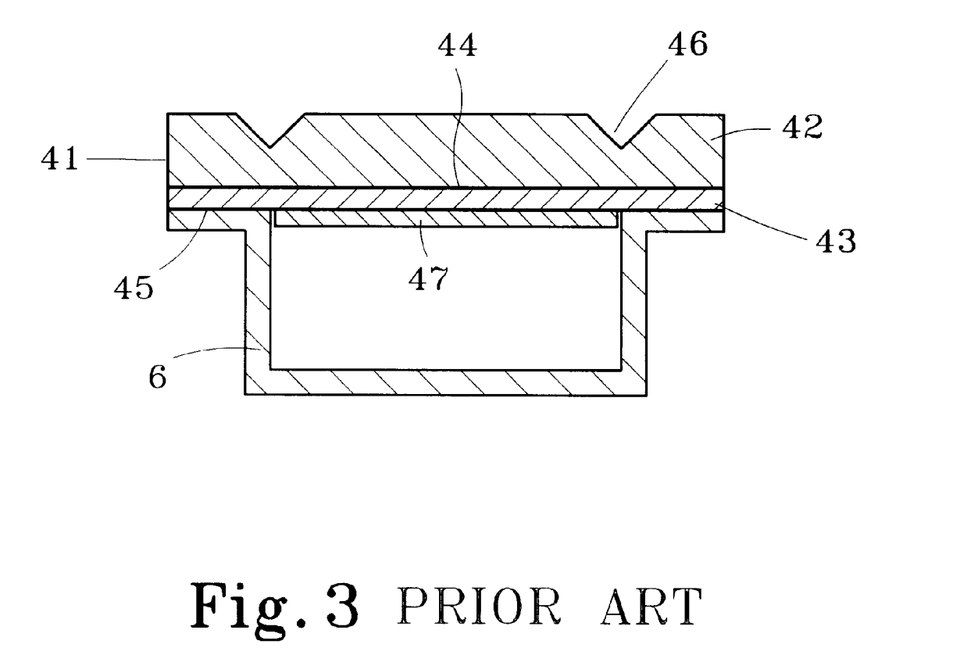
FIG. 3 is a cross-sectional view showing still another structure of the cover tape bonded to a carrier tape according to the prior art.

FIG. 3 shows another structure of cover tape according to the prior art. The cover tape 41 comprises a biaxially extended film 42, an intermediate layer 43, and a back layer 47. The biaxially extended film 42 and the intermediate layer 43 are bonded together by means of a first adhesive layer 44. The intermediate layer 43 is bonded to the carrier tape 6 by a second adhesive layer 45. The back layer 47 is bonded to the intermediate layer 43 by the second adhesive layer 45. The biaxially extended film 42 has longitudinal score lines 46. The cohesive strength along the longitudinal score lines 46 is the weakest. The longitudinal score lines 46 can be scored prior to be sealed with the carrier tape 6 or during the sealing process. When the cover tape 41 is peeled off after it has been bonded to the carrier tape 6 by a heat press, it is torn along the longitudinal score lines 46. This structure may provide a better adhesion strength to the carrier tape 6. Unfortunately, a precision scoring process must be employed to cut the biaxially extended film 42. The application of the precision scoring process requires a cutting tool, a pressure and temperature control system. Because of weak cohesive strength along the scored lines 46 and the effect of thermal shrinkage of the film, the scored depth of the longitudinal score lines 46 and the ratio of depth of the scored line 46 and thickness of the film affect actual application of the cover tape 41. This longitudinally grooved, biaxially extended film 42 is fragile to impact force and stress build-up due to the effect of thermal shrinkage.

Practically encased objects of either electronic active components or passive components use to be brought together on the printed circuit board. Active components are usually sensitive to the static charge. Static charge impact can easily damage the active components during packaging or transferring. However, static charge impact to impose on the active components may occur via the contact with a charge carried passive component or via the charge induction from the other charge carried components indirectly. Therefore, an antistatic or charge dissipation treatment is needed.

The U.S. Pat. Nos. 5,441,809 and 5,599,621 describe a cover tape structure for the surface mounting device packaging that has a peeling force of between 30 and 80 grams per millimeter after heat-sealed to a carrier tape to form a two-piece package for the electronic parts. The cover tape comprises a polymeric film, one side of which is coated with a layer of metal, and a heat sealable adhesive is laminated to the metal-coated side of the film, the adhesive layer comprising thermoplastic elastomer, metal powder or the metal coated particle. Because of the certain characteristics of the material compatibility, phase separation may occur if this blend material is used under the high level of humidity and temperature over the elapsed time. Therefore, the physical property of this adhesive layer, such as the peeling strength, can deviate from within 30–80 grams per millimeter to the improper application range. If the peeling strength is too low, the cover tape can be loosen from the carrier tape during the packaging and processing and the packaged parts can be lost. If the peeling strength is too high, then the carrier tape can have the jumping-off problem due to a step motion detaping operation and the packaged part lost or position misplaced. Further, due to the chemical composition of the adhesive layer, the cover tape may be suitable for sealing a carrier tape made a particular material, for example, the polystyrene.

SUMMARY OF THE INVENTION

The present invention has been accomplished under the circumstances in view. It is the main object of the present invention to provide a cover tape for packaging which achieves a satisfactory bonding effect when bonded to the carrier tape, so that encased objects are prohibited from dropping off. It is another object of the present invention to provide a cover tape for packaging that can be smoothly peeled off after it has been bonded to the carrier tape, without causing a jumping off problem to the encased objects. According to the present invention, the cover tape comprises a cover layer, a randomly embossed layer, an adhesive layer and a non-adhesive layer arranged in a stack in the proper order and respectively fastened to one another.

The adhesive layer of the cover tape can be selected from any kind of adhesive series or heat activated materials subject to that the adhesion force of the adhesive layer to the carrier tape is greater than the applied tearing force to the randomly embossed layer. The adhesive layer can be made from the pressure-sensitive adhesives, heat sealable elastomers, heat activated elastomers and thermoplastics. Suitable materials for the adhesive layer include cyanoacrylate adhesives, acrylic adhesives, polyurethane adhesives, polyester unsaturated adhesives, silicon elastomers, natural or synthetic rubbers, hot melt elastomers, thermoplastics, etc. Materials having a saturated chemical bonding structure and flame retardant, weather resistance and anti-radiation properties are preferably recommended. The carrier tape or the carrier tray can be selected from a wide range of materials including natural or synthetic paper, plastics, ceramics, metal, non-metal materials, inorganic compound or compound of the aforesaid materials. Further, the recycled materials from the aforesaid items or their compound are acceptable. In addition to the selection of the material of the cover tape and the coupled carrier, morphology of the contact surface of the adhesive layer and the carrier tape and their surface energy or tension are the important factors that affect the adhesion strength and sealing condition after bonding. In order to improve adhesion strength, the randomly embossed layer and the non-adhesive layer may be treated through a flame treatment, plasma treatment, corona discharge treatment, or coated with a layer of primer. A sandblasting processing, electroplating or electronic polishing process may be employed to the surface of the adherend to improve the surface adhesion strength.

DETAILED DESCRIPTION OF THE PREFERRED EMBODIMENT

Figure 4:
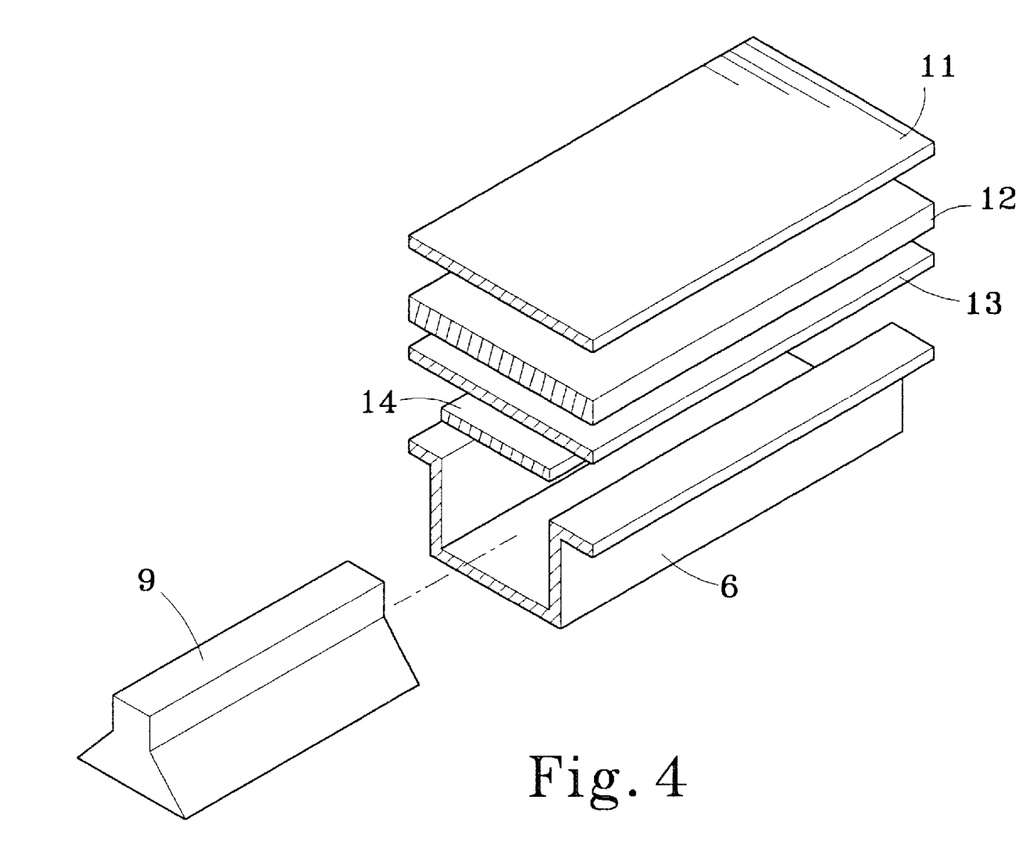
FIG. 4 is a perspective exploded view of a tape for encasing the electronic parts according to one embodiment of the present invention.

Referring to FIG. 4, there shows a tape for encasing the electronic parts comprising a carrier tape 6 having a plurality of recesses for encasing the electronic parts 9, and a cover tape 1 adapted to seal only recesses of the carrier tape 6 for the electronic parts 9. The cover tape 1 is a multi-layer covering comprises a randomly embossed layer 12 and a release coating layer 11 covering over one side of the randomly embossed layer 12. The randomly embossed layer 12 is a biaxially extended film selected from a group of biaxially extended polyester film, polypropylene film, polystyrene film, polycarbonate film, polyimide film, polyvinyl chloride film, synthetic paper film, blend of PE and PP, or blend of PE and PET, having randomly arranged holes processed by an embossing roller. The embossing roller surface is coated with the numerous outward sharpen tips throughout the whole cylindrical surface. At an opposite side of the randomly embossed layer 12, there are provided with an adhesive layer 13 and a non-adhesive layer 14 over the adhesive layer 13. The non-adhesive layer 14 has one side adhered to the adhesive layer 13, and an opposite side processed by metal vapor deposition or coated with a layer of antistatic coating.

In order to prevent the static charge impact damage imposed on the packed components, the exterior surface of the cover layer 11 may be coated with either an antistatic agent or charge dissipation media or the like. The way of charge dissipation or eliminating static charge can be achieved subject to: (1) using ionic and non-ionic surfactant through internal blending or external coating; (2) metal vapor deposition or coating of conductive material, for example, aluminum vapor deposition or coating of intrinsically conductive polyaniline lacquers. Antistatic coating or conductive coating can be a characteristic of the surface resistivity less than 10E13 ohms per square. Material for the randomly embossed layer 12 must be transparent or translucent and have the suitable mechanical strength, and a thickness of 6–100 microns. The randomly embossed layer 12 and the non-adhesive layer 14 are processed through the flame treatment, plasma treatment or corona discharge, or coated with a primer, so as to enhance their surface adhesion strength. The adhesive layer 13 can be made by the pressure-sensitive adhesives, heat sealable elastomers, heat activated elastomers and thermoplastics. Suitable materials for the adhesive layer include cyanoacrylate adhesives, acrylic adhesives, polyurethane adhesives, polyester unsaturated adhesives, silicon elastomers, natural or synthetic rubbers, hot melt elastomers, thermoplastics, etc. The adhesive can be formulated either in waterborne or solvent bases. Material for the non-adhesive layer 14 can be obtained from a biaxially extended film such as the polyester film, polypropylene film, polystyrene film, polycarbonate film, polyimide film, polyvinyl chloride film, synthetic paper, metal foil, blend of PE and PP, blend of PE and PET or plastic film with metal vapor deposition or antistatic agent or the like. It has certain mechanical strength, and can be transparent or translucent. The thickness of the material used is subject to actual requirement. Further, the non-adhesive layer 14 can be made by lacquer printing and then through either thermal cure or radiation cure.

Figure 5A:
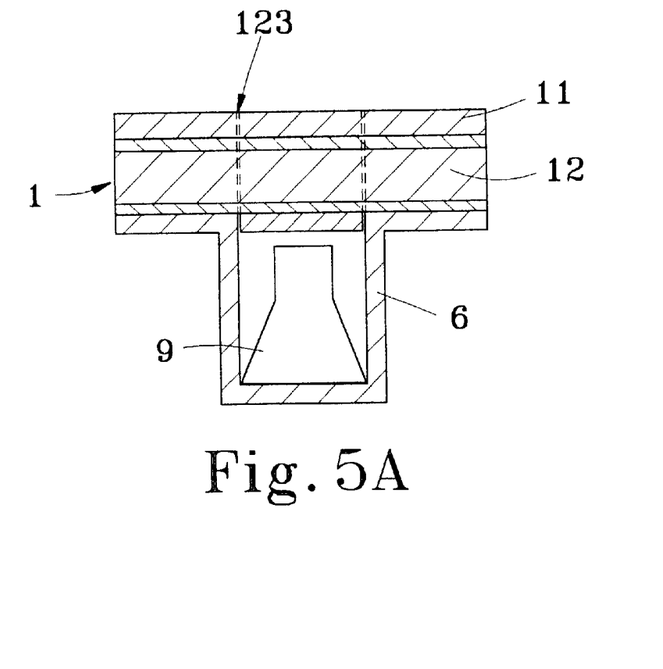
FIG. 5A is a cross-sectional view showing the cover tape bonded to the carrier tape according to the present invention.
Figure 5B:
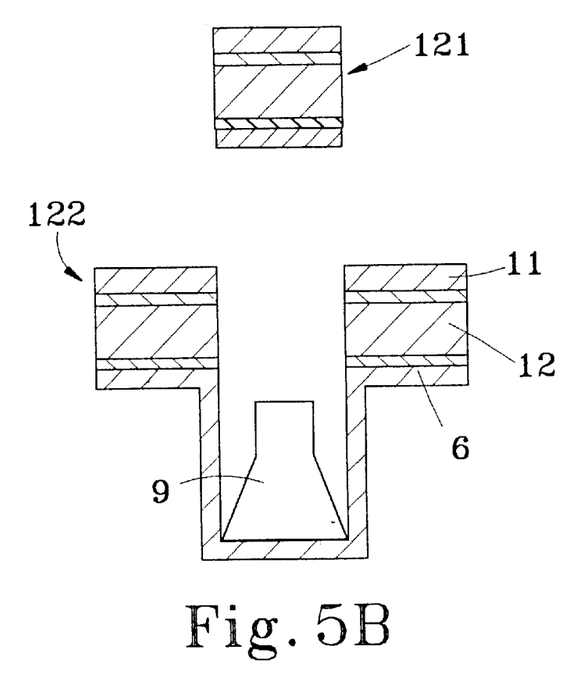
FIG. 5B a cross-sectional view showing a state of the cover tape of FIG. 5A where the cover tape has been bonded to the carrier tape and then peeled off therefrom.
Figure 6:
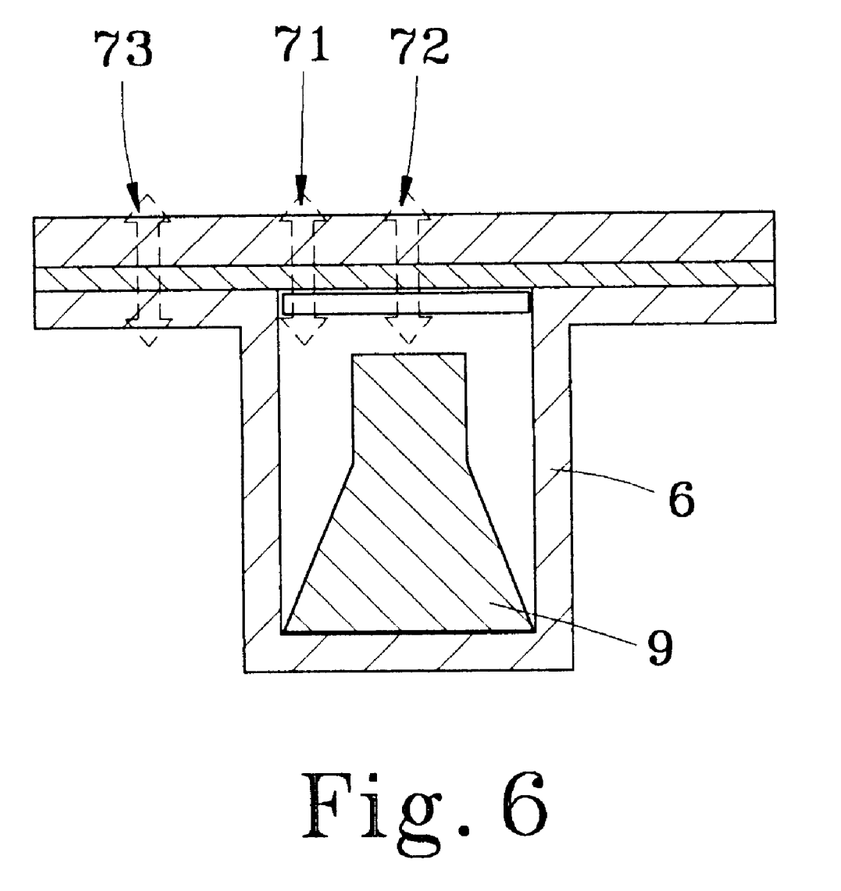
FIG. 6 a cross-sectional view showing a tearing force along the stress concentration zone and two adhesion forces of the embossed layer to the carrier tape and non-adhesive layer respectively.

FIGS. 5A and 5B are a bonded view in section and a torn-off view in section of the tape shown in FIG. 4. In the bonded view, the randomly embossed layer 12 is divided into a torn strip portion 121, an adhesion portion 122, and a stress concentration zone 123. When the cover tape 1 and the carrier tape 6 are fastened together by pressing, heat sealing or any other sealing methods, the adhesion portion 122 with the randomly embossed layer 12 is bonded to the carrier tape 6 having an enhanced mechanical tensile strength. The center portion of the randomly embossed layer 12 is adhered to the non-adhesive layer 14 by the adhesive layer 13 to form a compound film having a higher mechanical tensile strength. The stress concentration zone 123 is disposed between the carrier tape 6 and the non-adhesive layer 14 at the border area. Because the stress concentration zone 123 is formed by the randomly embossed layer 12 only, its mechanical tensile strength is the weakest in comparison with the mechanical tearing strength of adhesion portion 122 and the central portion of the cover tape 1 containing the randomly embossed layer 12 and the non-adhesive layer 14. Because the randomly embossed layer 12 have the numerous randomly embossed holes throughout the surface, and thereby forming a zone of stress concentration throughout the surface. When tearing the tape, these randomly distributed holes within the stress concentration zone conduct the direction of the tearing stress along the shortest distance between the adjacent embossed holes tortuously. Therefore, small applied tearing force is needed to tear the tape, i.e., the minimum tearing force applied to peel off the torn strip portion 121 from the adhesion portion 122 is smaller than the adhesion force of the adhesion portion 122 to the carrier tape 6 and the adhesion force of the center portion of the randomly embossed layer 12 to the non-adhesive layer 14. It shows extremely smooth and uniform tearing when peeling the torn strip portion 121 off the cover tape from the adhesion portion 122 of the carrier tape 6. FIG. 6 shows a tearing force 71 (F1) along the stress concentration zone, an adhesion force of the embossed layer 12 to the non-adhesive layer 72 (F2) and an adhesion force of the embossed layer 12 to the carrier tape 73 (F3) respectively. The position of tear line is highly dependent upon the tear rate and the ratio of applied tearing force 71, to adhesion forces 72 and 73. Where F1: Applied tearing force along the stress concentration zone F2: Adhesion force between the embossed layer 12 and the non-adhesive layer 14.

F3: Adhesion force between the embossed layer 12 and the top surface of the carrier tape 6 or carrier tray 5.

The present invention also demonstrates a different construction of cover tape, a narrower strip of a non-adhesive layer coated with an adhesive is laminated to a cover layer, a randomly embossed layer, in the middle and leaves two parallel longitudinal adhesive uncovered edge surfaces. Prior to encase the component, a suitable adhesive is applied to the surface of either two parallel longitudinal adhesive uncovered edge surfaces of embossed layer or the edge surface of carrier tape in a way of zone coating. These aforesaid adhesive zone coating parallel longitudinal edge surfaces are then adhered to the surface of either the edge surfaces of carrier tape or two parallel longitudinal adhesive uncovered edge surfaces of embossed layer.

The stress concentration zone 123 is disposed between the bonded edge surfaces of carrier tape 6 and the border area of non-adhesive layer 14. Again the stress concentration zone 123 is formed by the randomly embossed layer 12 only, its mechanical tensile strength is the weakest in comparison with the mechanical tearing strength of adhesion portion 122 and the central portion of the cover tape 1 containing the randomly embossed layer 12 and the non-adhesive layer 14.

Table 1 shows a peeling adhesion force test made on a embossed biaxially extended polypropylene adhesive tape having a thickness of 29 micrometers and a width of one inch relative to different adherend materials at different peeling angles:

TABLE 1

| A\F | SS | PSC | PCC | SS | PSC | PCC |
|-----|-----|------|-----|------|------|------|
| 90  | 769 | 1061 | 881 | 895  | 895  | 1295 |
| 120 | 760 | 724  | 683 | 769  | 675  | 901  |
| 150 | 616 | 576  | 648 | 630  | 598  | 809  |
| 170 | 395 | 485  | 496 | 520  | 469  | 679  |
| 180 | 1090| 1024 | 923 | 1093 | 1297 | 1037 |

The embossed biaxially extended polypropylene adhesive tape used in the aforesaid test is obtained from a embossed biaxially extended polypropylene film having one side coated with a pressure-sensitive layer of acrylic adhesive having a thickness of 20 micrometers and a width of one inch. In Table 1, A: peeling angle (degree); F: adhesion force (grams); SS: stainless steel sheet; PSC: polystyrene plate blended with conductive carbon black; PCC: polycarbonate plate blended with conductive carbon black.

In another example, the embossed biaxially extended polypropylene tape having a width of one inch and a thickness of 29 micrometers is laminated with a biaxially extended polyester film on the adhesive coated side in the middle, which has a width of 0.5 inch and a thickness of 25 micrometers. The adhesive tape is respectively adhered to the stainless steel plate and the carbon powder blended polystyrene plate. During the peeling test, torn strip portion is peeled off from the adhesion portion at a peeling angle of 180° and a tearing speed of 24 inches/minute, and then the tearing forces are measured respectively. Both tearing forces show the same result at a tearing force of 24 grams. The tearing force, which is directly proportional to the tearing speed and the tearing line, becomes closer to the two opposite lateral sides of the non-adhesive layer when the tearing speed is increased. The stress concentration effect becomes enhanced when the tearing speed is increased, causing the edge of the embossed film to be sharpened along the tearing lines within the stress concentration zone.

Table 2 shows a back peeling adhesion test made on the different thickness of the embossed biaxially extended polypropylene and polyethylene terephthalate adhesive tapes against a polyethylene terephthalate film having a thickness of 25 micrometers and a width of one inch at a tearing speed of 24 inches per minute:

TABLE 2

| Embossed biaxially extended polymeric films | KFOPP | KFOPP | KFOPP | KFPET |
|---|---|---|---|---|
| Thickness (micrometers) | 20 | 29 | 40 | 12 |
| Back adhesion force | 1146 | 1033 | 1091 | 1463 |

In Table 2, KFOPP and KFPET stand for the embossed biaxially extended polypropylene and polyethylene terephthalate films respectively.

Table 3 shows a applied tearing force test in which one inch wide embossed biaxially extended polypropylene (PP) and polyethylene terephthalate (PET) tapes which have different thickness are respectively adhered with a biaxially extended polyester film having a width of 0.5 inch and a thickness of 25 micrometers in the middle at one side. The compound adhesive tape is then adhered to a standard stainless steel plate, and the torn strip portion is peeled off along the stress concentration zones at a peeling angle of 180° and a peeling speed of 24 inches/minute. The applied tearing force from above tapes is measured.

TABLE 3

| Embossed biaxially extended polymeric films | KFOPP | KFOPP | KFOPP | KFPET |
|---|---|---|---|---|
| Thickness (micrometers) | 20 | 29 | 40 | 12 |
| Tear force (g/inch) | 11 | 24 | 28 | 14 |

According to the aforesaid Table 1, Table 2 and Table 3, the present invention is not limited to a particular adhesive material; the tearing force needed to tear off the randomly embossed layer 12 is about 10 to 100 grams only which is smaller than the adhesion strength among layers of the torn strip portion and the adhesion strength between the embossed film and the adherend object (the carrier tape 6). This applied tearing force is far less than the adhesion strength of the embossed film against the carrier tape and the laminated non-adhesive film. It is not necessary to limit the adhesion force, and torn strip portion can be positively separated from the carrier tape 6 along the stress concentration zones 123. Because the applied tearing force needed to separate the torn strip portion 121 from the cover tape 1 at different angles is small, the torn strip portion 121 can be separated from the cover tape 1 smoothly without causing a vibration to the carrier tape 6 in forcing the encased parts jumping out of place. Further, because of the guidance of stress concentration zone, and tearing direction can be maintained in course.

Figure 7:
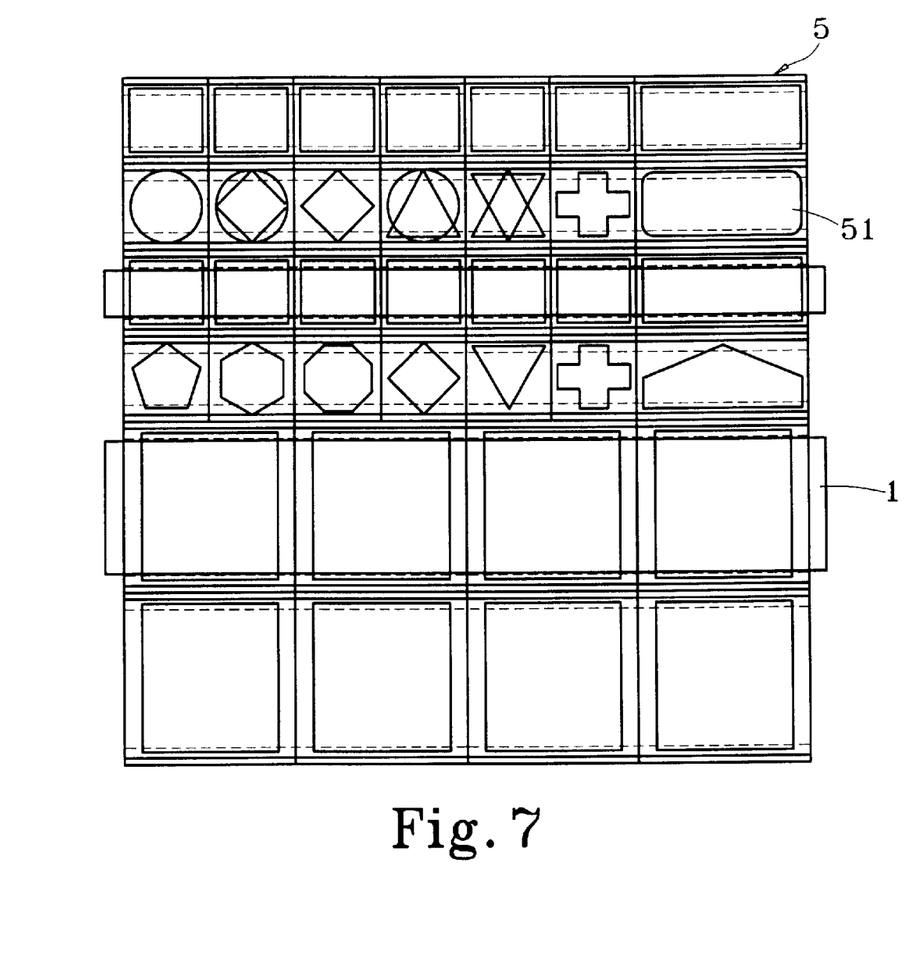
FIG. 7 is a top plain view of a two-dimensional carrier tray for encasing the components according to an alternate form of the present invention.

FIG. 7 shows an alternative form of the cover tape 1 adapted to seal a two dimensional carrier tray 5 having recesses of different shapes 51 and depths for encasing the electronic parts 9. The carrier tray 5 can be made from paper, synthetic paper, plastics, ceramics, metal or non-metal materials, or a compound of the aforesaid materials, or recycled from the aforesaid materials. The surface of the cover tape 1 may be printed by ink printing with company name, trade name, product name, identification bar code, etc., for recognition by users or automatic recognition apparatus.

It is to be understood that the drawings are designed for purposes of illustration only, and are not intended as a definition of the limits and scope of the invention disclosed.

Figure 8:
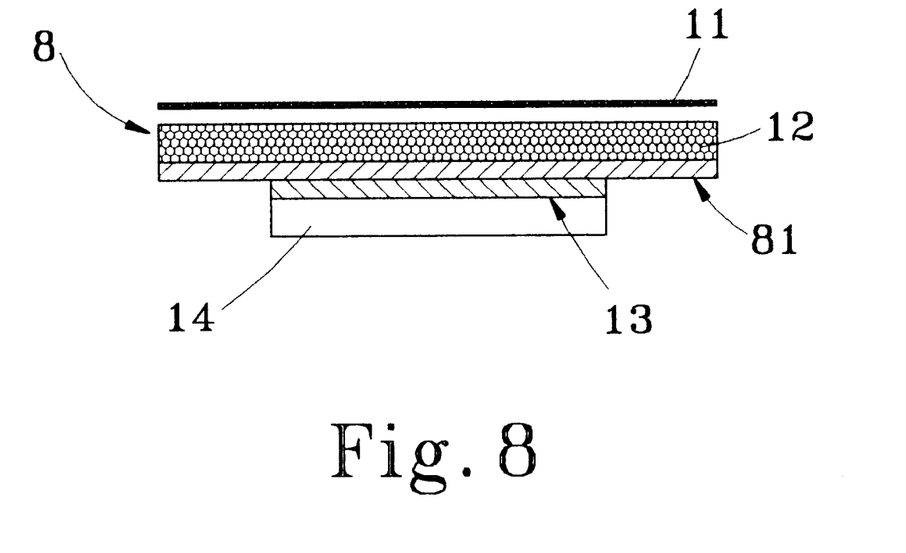
FIG. 8 is a cross-sectional view showing a tape for encasing electronic parts according to an alternative embodiment of the invention.

FIG. 8 further shows a different construction of a cover tape 8 for encasing the electronic parts 9. The cover tape 8 is a multi-layer covering comprises a randomly embossed layer 12, a release-coating layer 11 covering over one side of the randomly embossed layer 12, and a thermally activated thermoplastic or hot melt elastomer layer 81 on the opposite side of the randomly embossed layer 12. A narrower strip of non-adhesive layer 14 is coated with an adhesive layer 13, preferably pressure-sensitive adhesive. The middle portion of the randomly embossed layer 12 is adhered to the non-adhesive layer 14 by the thermally activated thermoplastic or hot melt elastomer 81 and the adhesive layer 13 to form a compound film, cover tape. In order to bond the cover tape 8 to carrier tape 6, the heat sealable thermoplastic or hot melt elastomer of the cover tape 8 is thermally activated by the application of heat with a suitable sealing pressure at the contact points along two parallel linear edge surfaces. Again, there are two stress concentration zones, which disposed between the carrier tape 6 and the non-adhesive layer 14 at the border areas. When cover tape 8 is peeled off from the carrier tape, only a small applied tearing force is needed to tear the medial torn strip portion from the adhesion portion along the stress concentration zones.

What is claimed is:

1. A cover tape for encasing electronic parts or components in a carrier tape or carrier tray, said cover tape comprising:

an adhesive layer having an upper surface and a lower surface;

a randomly embossed layer adhered to said upper surface of said adhesive layer wherein said upper surface of said adhesive layer is covered by said randomly embossed layer; said randomly embossed layer having a plurality of randomly arranged holes therethrough;

a non-adhesive layer having two edges running along either side thereof, said non-adhesive layer being adhered to said lower surface of the adhesive layer and said non-adhesive layer being narrower than said adhesive layer and being positioned on said adhesive layer beneath said randomly embossed layer so that only a central portion of said randomly embossed layer with said adhesive layer thereon is covered with said non-adhesive layer, thereby defining a pair of exposed adhesion portions comprised of said randomly embossed layer with said adhesive layer thereon; said adhesion portions being located along the edges of said non-adhesive layer for adhering said cover tape to a carrier tape or carrier tray wherein said edges of said non-adhesive layer define a pair of stress concentration zones which extends through said randomly embossed layer along the edges of said non-adhesive layer;

said stress concentration zones defining a torn strip portion comprised of said non-adhesive layer and all the layers adhered to said non-adhesive layer between said pair of stress concentration zones;

said torn strip portion being peelable from said adhesion portions along said pair of stress concentration zones to permit removal of encased electronic parts from the carrier tape or carrier tray when said exposed adhesion portions are adhered to said carrier tape or carrier tray.

2. The cover tape of claim 1, wherein said torn strip portion is peeled off from said adhesion portion along said stress concentration zone with an applied tearing force smaller than the adhesion force existing between said adhesion portion and said adhesive layer of the carrier tape.

3. The cover tape of claim 1, wherein said torn strip portion is peeled off from said adhesion portion along said stress concentration zone with an applied tearing force smaller than the adhesion force existing between said torn strip portion and said non-adhesive layer through said adhesive layer.

4. The cover tape of claim 1, wherein said randomly embossed layer has a side opposite to said adhesive layer covered with a release coating layer.

5. The cover tape of claim 4, wherein said release coating layer is treated by a process selected from the group consisting of drying, thermal cure, and radiation cure.

6. The cover tape of claim 1, wherein said randomly embossed layer has an opposite side to said adhesive layer covered with an antistatic coating layer.

7. The cover tape of claim 6, wherein said antistatic coating layer is surfaced by a process selected from the group consisting of surfactant coating, radiation cured printing coating, conductive lacquer coating, and metal vapor deposition.

8. The cover tape of claim 1, wherein said randomly embossed layer has an opposite side to said adhesive layer coated with an ink printing.

9. The cover tape of claim 1, wherein said randomly embossed layer is a biaxially extended film selected from the group consisting of nylon, polyester, polyethylene terephthalate (PET), polyethylene (PE), polypropylene (PP), polystyrene (PS), polycarbonate (PC), polysulfone, polyimide (PI), polyvinyl chloride (PVC), polypropylene synthetic paper, polyethylene terephthalate synthetic paper, blend of PE and PP, and blend of PE and PET.

10. The cover tape of claim 1, wherein said non-adhesive layer is a biaxially extended film selected from the group consisting of nylon, polyester, polyethylene terephthalate (PET), polyethylene (PE), polypropylene (PP), polystyrene (PS), polycarbonate (PC), polysulfone, polyimide (PI), polyvinyl chloride (PVC), polypropylene synthetic paper, and polyethylene terephthalate synthetic paper, blend of PE and PP, and blend of PE and PET.

11. The cover tape of claim 1, wherein said non-adhesive layer is a metal foil.

12. The cover tape of claim 1, wherein said non-adhesive layer has one side which faces the encased electronic parts coated with an antistatic coating layer.

13. The cover tape of claim 12, wherein said antistatic coating layer is surfaced by a process selected from the group consisting of antistatic surfactant coating, radiation cured printing coating and conductive lacquer coating.

14. The cover tape of claim 1 wherein said non-adhesive layer has one side facing to said carrier tape or carrier tray coated with a charge dissipation coating layer.

15. The cover tape of claim 14, wherein said charge dissipation coating layer is selected the group consisting of conductive lacquer coating, metal vapor deposition, and metal foil.

16. The cover tape of claim 1, wherein said randomly embossed layer is coated with a layer of primer.

17. The cover tape of claim 1, wherein the surface of said randomly embossed layer is treated with a flame treatment.

18. The cover tape of claim 1, wherein the surface of said randomly embossed layer is treated with a plasma treatment.

19. The cover tape of claim 1, wherein the surface of said randomly embossed layer is treated with a corona discharge treatment.

20. The cover tape of claim 1, wherein the surface of said non-adhesive layer is coated with a layer of primer.

21. The cover tape of claim 1 wherein the surface of said non-adhesive layer is treated with a flame treatment.

22. The cover tape of claim 1, wherein the surface of said non-adhesive layer is treated with a corona discharge treatment.

23. The cover tape of claim 1, wherein the surface of said non-adhesive layer is treated with a plasma treatment.

24. The cover tape of claim 1, wherein said non-adhesive layer is composed of multiple strips.

25. The cover tape of claim 24, wherein said multiple strips are spaced from one another by a pitch.

26. The cover tape of claim 1, wherein said non-adhesive layer is divided into a plurality of non-adhesive zones by die cutting to fit the shape and size of the carrier tape or carrier tray.

27. A cover tape for encasing electronic parts or components in a carrier tape or carrier tray, said cover tape comprising:
   a randomly embossed layer having upper and lower surfaces with said lower surface having a coating adhered thereon, said coating being a thermally activated thermoplastic layer or a hot melt elastomeric layer; said randomly embossed layer having a plurality of randomly arranged holes therethrough;
   a non-adhesive layer having two edges running along either side thereof;
   an adhesive layer situated between said coating and said non-adhesive layer whereby said adhesive layer adheres said non-adhesive layer to said coating;
   said adhesive and said non-adhesive layers being narrower than said randomly embossed layer and being narrower than said coating adhered to said randomly embossed layer and said adhesive and said non-adhesive layers being positioned so that only a central portion of said randomly embossed layer with said coating thereon is covered by said adhesive and non-adhesive layers, thereby defining a pair of exposed adhesion portions comprised of said randomly embossed layer with said coating thereon;
   said adhesion portions being located along the edges of said non-adhesive layer for adhering said cover tape to a carrier tape or carrier tray whereby said edges of said non-adhesive layer define a pair of stress concentration zones which extend through said randomly embossed layer along the edges of said non-adhesive layer;
   said zones of stress concentration defining a torn strip portion comprised of said non-adhesive layer and all the layers adhered to said non-adhesive layer between said stress concentration zones;
   said torn strip portion being peelable from said adhesion portions along said pair of stress concentration zones to permit removal of encased electronic parts from the carrier tape or carrier tray when said exposed adhesion portions are adhered to said carrier tape or carrier tray.

* * * * *